(12) United States Patent
Chang et al.

(10) Patent No.: US 11,205,709 B2
(45) Date of Patent: Dec. 21, 2021

(54) DEFECT FILLING IN PATTERNED LAYER

(71) Applicant: Taiwan Semiconductor Manufacturing Company, Ltd., Hsinchu (TW)

(72) Inventors: Chia-Ao Chang, Jinhu Township (TW); Chien-Hao Chen, Chuangwei Township (TW); De-Wei Yu, Ping-tung (TW); Yung-Cheng Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 164 days.

(21) Appl. No.: 16/017,153

(22) Filed: Jun. 25, 2018

(65) Prior Publication Data

US 2019/0393325 A1 Dec. 26, 2019

(51) Int. Cl.
*H01L 29/66* (2006.01)
*H01L 21/8234* (2006.01)
*H01L 21/762* (2006.01)
*H01L 29/49* (2006.01)

(52) U.S. Cl.
CPC .. *H01L 29/66545* (2013.01); *H01L 21/76283* (2013.01); *H01L 21/823431* (2013.01); *H01L 29/4966* (2013.01); *H01L 29/6656* (2013.01); *H01L 29/66636* (2013.01)

(58) Field of Classification Search
CPC ........... H01L 29/4908; H01L 29/66545; H01L 21/76283; H01L 21/823431; H01L 29/4966; H01L 29/6656; H01L 29/66636
See application file for complete search history.

(56) References Cited

U.S. PATENT DOCUMENTS

| | | | | |
|---|---|---|---|---|
| 5,429,730 A | * | 7/1995 | Nakamura | B05D 5/005 204/192.34 |
| 2015/0236085 A1 | * | 8/2015 | Dong | H01L 29/7813 257/330 |
| 2015/0255273 A1 | * | 9/2015 | Miao | H01L 21/78 257/622 |
| 2017/0179120 A1 | * | 6/2017 | Cheng | H01L 29/0657 |
| 2019/0078211 A1 | * | 3/2019 | Kuenle | C23C 16/54 |
| 2019/0165144 A1 | * | 5/2019 | Chen | H01L 29/66818 |
| 2019/0333828 A1 | * | 10/2019 | Seddon | H01L 22/22 |
| 2019/0378764 A1 | * | 12/2019 | Cheng | H01L 21/823864 |

OTHER PUBLICATIONS

Vayrette et al., , Size dependent fracture strength and cracking mechanisms in frestanding polycrystalline silicon films with nanoscale thickness, 2016, Engineering fracture mechanics 168, 190-203 (Year: 2016).*

* cited by examiner

*Primary Examiner* — Steven B Gauthier
*Assistant Examiner* — Christopher A Culbert
(74) *Attorney, Agent, or Firm* — Slater Matsil, LLP (57) ABSTRACT

Embodiments disclosed herein relate generally to forming a structure, e.g., in high aspect ratio trenches. In an embodiment, a method for semiconductor processing is provided. The method includes forming fins on a substrate. Sidewalls of the fins and a bottom surface between the sidewalls of the fins define a trench therebetween. The method includes forming a gate structure over the fins. The gate structure has a sidewall with a defect region formed therein. The method includes forming a filling layer to fill the defect region in the sidewall of the gate structure.

20 Claims, 12 Drawing Sheets

DEFECT FILLING IN PATTERNED LAYER

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. With the decreasing in scaling, however, it has been challenging to deposit a film in high aspect ratio trenches with small dimension.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, for examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to filling a defect region (e.g., a void or seam) in a deposited film or layer in semiconductor processing. Embodiments specifically described herein are in the context of forming a dummy gate structure. A dummy gate layer can be deposited using, for example, a cyclic deposition-etching process. After depositing the dummy gate layer, a patterning process can be performed on the deposited dummy gate layer. A treatment process can be performed on the surfaces of the dummy gate structures. After treatment, a deposition and etching process can be performed on the dummy gate layer. The deposition and etching processes can fill or eliminate voids or seams in the patterned dummy gate layer.

Figure 1:
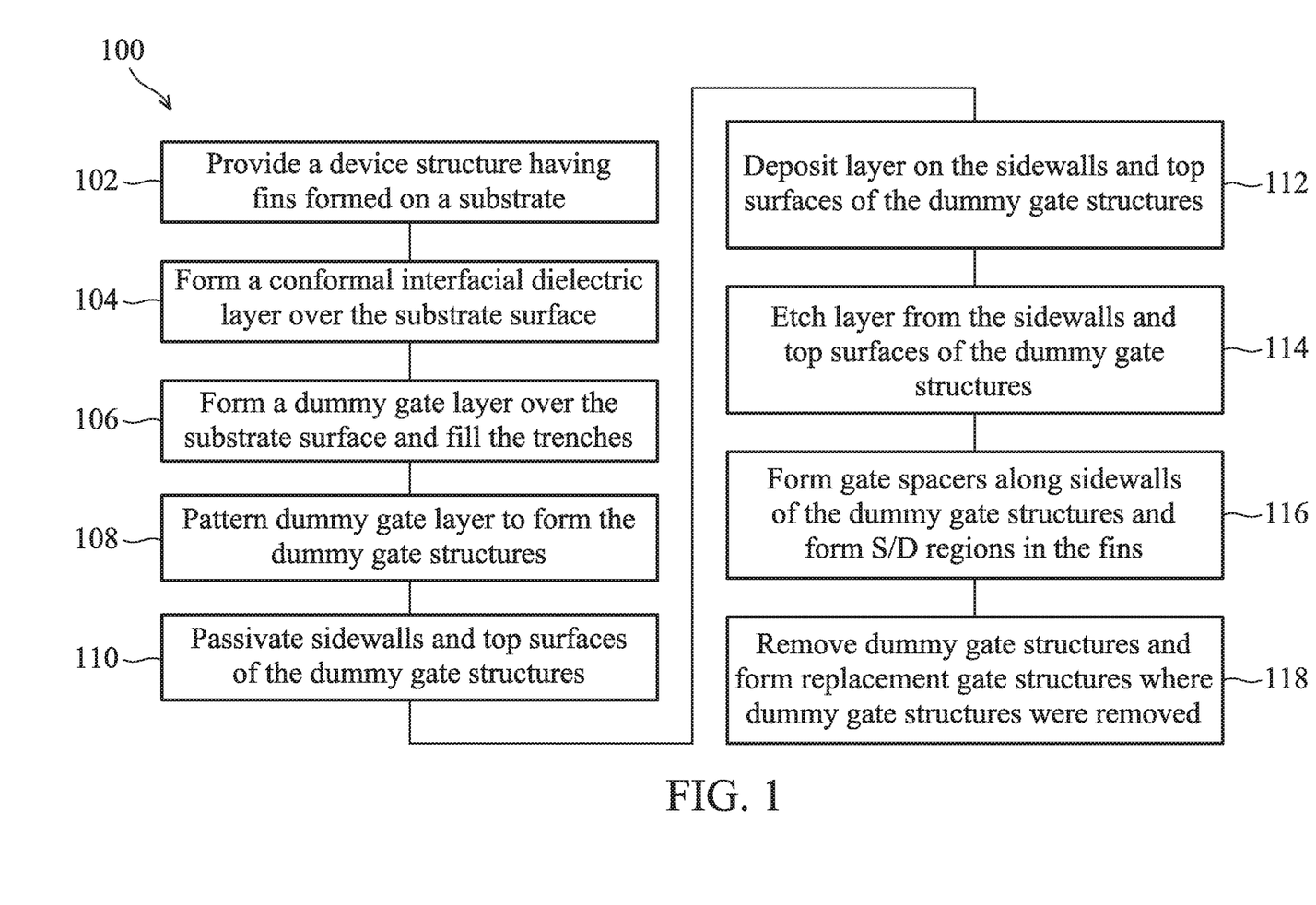
FIG. 1 is a flow chart illustrating an example method for fabricating a semiconductor device structure according to some embodiments.

FIG. 1 is a process flow wo illustrating an exemplary method for fabricating a semiconductor device structure 200 according to some embodiments. FIGS. 2 through 10C are schematic three-dimensional and cross-sectional views of a portion of the semiconductor device structure 200 corresponding to various stages of fabrication according to the flow chart of FIG. 1 in accordance with some embodiments. It is noted that the process flow wo may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

Figure 2:
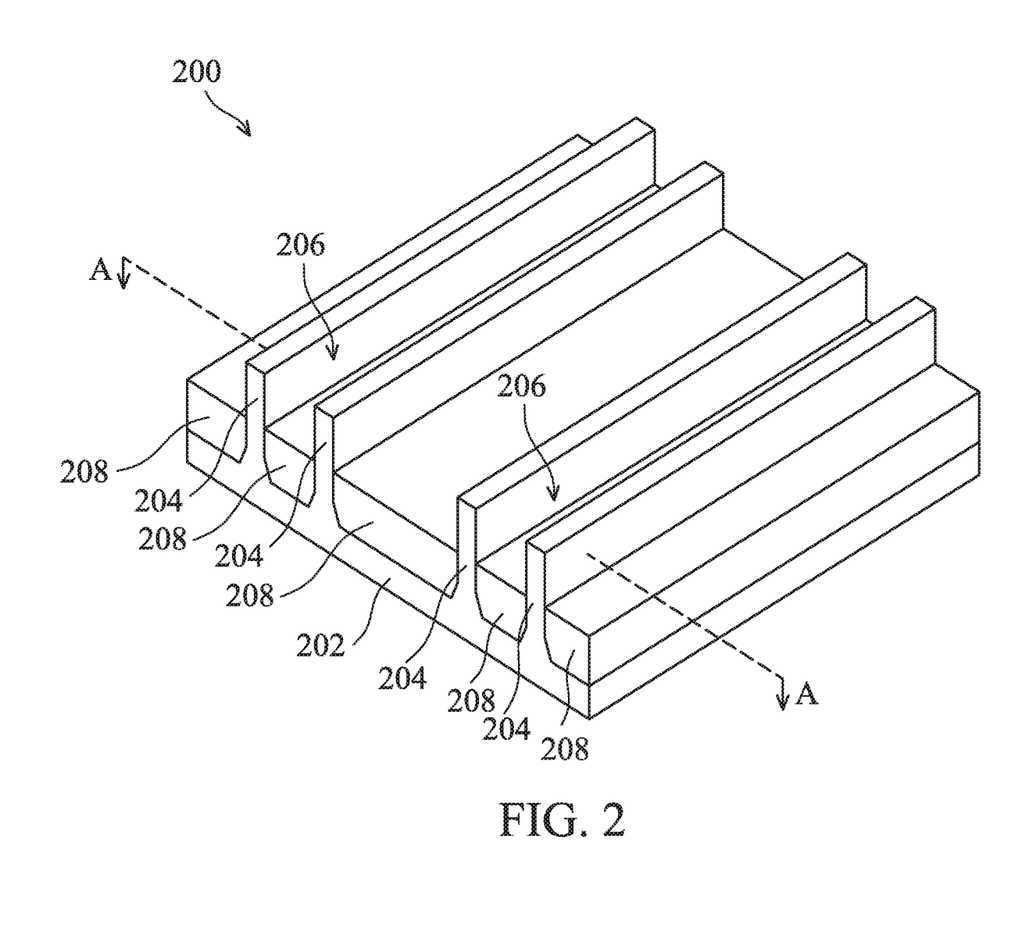
FIGS. 2, 3, 4A, 4B, 5A-5D, 6A-6C, 7A-7C, 8A-8C, 9A-9C, and 10A-10C illustrate various schematic three-dimensional and cross-sectional views of an example semiconductor device structure corresponding to various stages of fabrication according to some embodiments.

The process flow 100 begins at operation 102, and further with reference to FIG. 2, by providing a semiconductor device structure 200. The semiconductor device structure 200 has fins 204 formed on a semiconductor substrate 202. The semiconductor substrate 202 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 202 may include an elemental semiconductor including silicon (Si) or germanium (Ge); a compound semiconductor; an alloy semiconductor; or a combination thereof. Each fin 204 provides an active area where one or more devices are to be formed. The fins 204 are fabricated using suitable processes performed on the semiconductor substrate 202, including masking, photolithography, and/or etch processes, to form trenches 206 in the semiconductor substrate 202, leaving the fins 204 extended upwardly from the semiconductor substrate 202. The trenches 206 may then be filled with an insulating material. The insulating material may be any suitable dielectric such as an oxide (e.g., silicon oxide), a nitride, the like, or a combination thereof. The insulating material is then recessed, such as by using an acceptable etch process, to form isolation regions 208. The insulating material is recessed such that the top portion of the fins 204 is exposed. The fins 204 protrude above and from between neighboring isolation regions 208.

Figure 3:
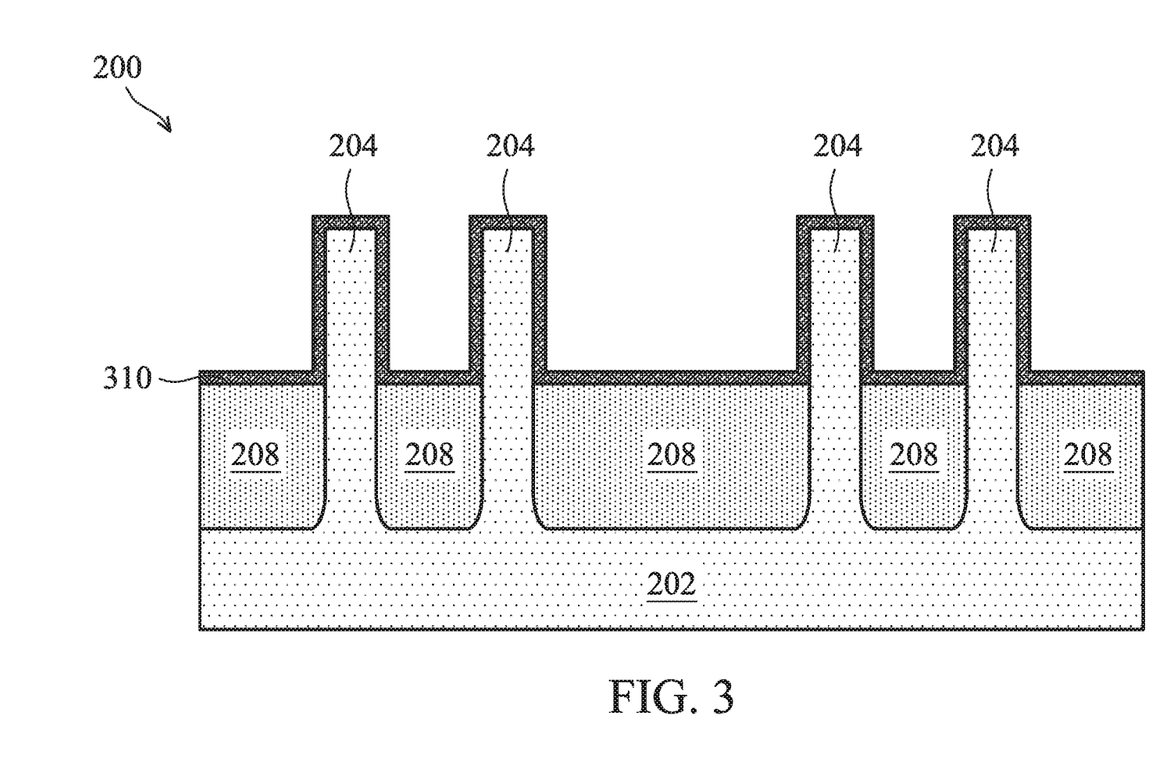
Figure 4A:
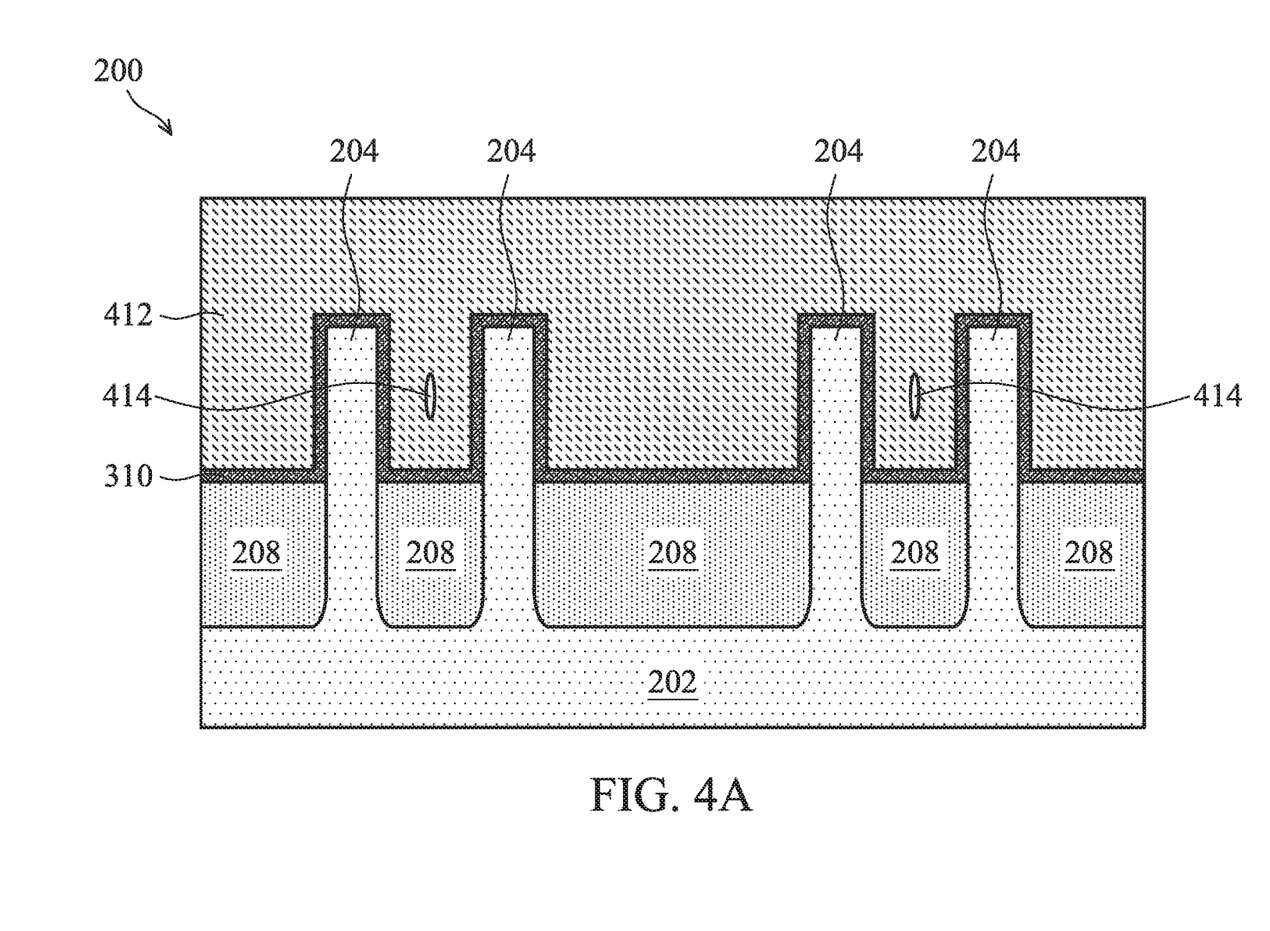

FIG. 2 further illustrates a cross-section A-A. FIGS. 3 through 4A illustrate cross-sections of the semiconductor device structure 200 corresponding to the cross-section A-A at various stages of fabrication.

At operation 104, and further with reference to FIG. 3, an interfacial dielectric layer 310 is conformally formed over the semiconductor substrate 202 to cover the fins 204 and the exposed surfaces of the isolation regions 208. The interfacial dielectric layer 310 may include or be silicon oxide, silicon nitride, the like, or multilayers thereof, and may be thermally and/or chemically grown on the fins 204, or conformally deposited, such as by plasma enhanced chemical vapor deposition (PECVD), atomic layer deposition (ALD), or any suitable deposition technique. In some embodiments, and further at operation 104, a seed layer (not shown) may be conformally formed on the interfacial dielectric layer 310. The seed layer can be formed on the interfacial dielectric layer 310 to help uniform growth of the subsequent dummy gate layer on the fins 204 and the isolation regions 208. The seed layer may be chosen depending on the material of the subsequent dummy gate layer. In some embodiments where the subsequent dummy gate layer includes silicon (e.g., polysilicon or amorphous silicon), the seed layer may be a silicon-containing film. In such a case, the seed layer can be formed by exposing the substrate surface to a silicon-containing compound to form a solid thin film layer containing silicon on the interfacial dielectric layer 310. The term "substrate surface" in this disclosure is intended to include the exposed surface of a film/layer or partial film/layer that has been deposited onto a substrate, such as the semiconductor substrate 202, and the exposed surface of the newly deposited film/layer can also become the substrate surface prior to any subsequent process(es). The seed layer may be formed by ALD, chemical vapor deposition (CVD), or any suitable deposition technique. In some embodiments, the seed layer is a silicon layer formed by ALD. Suitable silicon-containing compounds may include, but are not limited to, $(SiH_3)3N$, $Si[N(CH_3)_2]_4$, $SiH[N(CH_3)_2]_3$, $SiH_2[N(CH_3)_2]_2$, $SiH_3[N(CH_3)_2]$, $SiH_3[N((CH-(CH_3)_2)_2]$, the like, or combinations thereof. In some embodiments, the seed layer is formed using $SiH_3[N((CH-(CH_3)_2)_2]$.

After operation 106, a dummy gate layer 412 is formed over the substrate surface. In some embodiments, the substrate surface may include exposed surfaces of the interfacial dielectric layer 310 that is conformally formed on fins 204 and the upper surfaces of the isolation regions 208. In some embodiments, the substrate surface may include an exposed surface of the seed layer (if present) that is conformally formed on the interfacial dielectric layer 310.

The dummy gate layer 412 fills the trenches 206 and extends to a thickness above top surfaces of the fins 204. Each of the trenches 206 has a bottom surface (e.g., top surface of the isolation region 208) and sidewall surfaces extending upwardly from the bottom surface. In various embodiments, the trenches 206 may have an aspect ratio in a range from about 3:1 to about 30:1, such as about 5:1 to about 20:1, for example about 8:1 to about 10:1. The term "aspect ratio" refers to the ratio of the height dimension to the width dimension of a particular feature, for example, trench height/trench width. The trench height substantially equals to the height of the fins 204 protruding above the isolation regions 208 while the trench width substantially equals to the width or distance of the isolation region 208 between two neighboring fins 204.

The dummy gate layer 412 can be any suitable film. In some embodiments, the dummy gate layer 412 is an amorphous silicon (a-Si) film. In some embodiments, the dummy gate layer 412 may be poly-silicon or amorphous silicon.

The dummy gate layer 412 can be deposited by any suitable deposition process including, but is not limited to, low-pressure CVD (LPCVD), CVD, PECVD, ALD, plasma-enhanced ALD (PEALD), or any suitable deposition technique. In some embodiments, the deposition process is performed using LPCVD. In some examples, a process for depositing the dummy gate layer 412 may include exposing the substrate surface to a silicon-containing precursor. Suitable silicon-containing precursors may include silanes, halogenated silanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include, but are not limited to, a chlorinated silane, such as monochlorosilane ($SiH_3Cl$, MCS), dichlorosilane ($Si_2H_2Cl_2$, DCS), trichlorosilane ($SiHCl_3$, TCS), hexachlorodisilane ($Si_2Cl_6$, HCDS), octachlorotrisilane ($Si_3Cl_8$, OCTS), or silicon tetrachloride (STC). In some embodiments, the silicon-containing precursor may use organosilanes which may include compounds with the empirical formula $R_ySi_xH_{(2x+2-y)}$, where R is independently methyl, ethyl, propyl, or butyl, such as methylsilane $((CH_3)SiH_3)$, dimethylsilane $((CH_3)_2SiH_2)$, ethylsilane $((CH_3CH_2)SiH_3)$, methyldisilane $((CH_3)Si_2H_5)$, dimethyldisilane $((CH_3)_2Si_2H_4)$, hexamethyldisilane $((CH_3)_6Si_2)$, tris(dimethylamino)silane (TDMAS), and any combination thereof. While the material of the dummy gate layer 412 using silicon is discussed, the concept described herein is equally applicable to other materials such as silicon germanium, silicon carbide, silicon phosphorus, silicon carbon phosphorus, germanium, a III-V compound semiconductor, a II-VI compound semiconductor, or the like. In cases where silicon germanium is implemented, a germanium-containing precursor (e.g., $GeH_4$; $Ge_2H_6$, etc.) or a halogenated germanium precursor (e.g., $GeCl_4$, $GeHCl_3$, $Ge_2Cl_6$, $Ge_3Cl_6$, etc.) may be used in conjunction with any of the silicon-containing precursors discussed above to fill the trenches, such as the trenches 206.

In some examples, the dummy gate layer 412 is deposited using a conformal deposition process to fill the trenches 206 and switches to another deposition process after the trenches 206 are filled. In some examples, the dummy gate layer 412 may be deposited using a cyclic deposition-etch process to fill the trenches 206. For example, a cyclic deposition-etch process may include sub-cycles of a deposition process, followed by a chamber purge, followed by an etching process, and followed by a chamber purge. The deposition-etch processes can be repeated sequentially and/or alternatingly to gradually fill the trenches 206. In some examples, the deposition process continues until the dummy gate layer 412 obtains a desired thickness. For example, the deposition process can continue until lateral growth fronts of the dummy gate layer 412 in each high aspect ratio trench merge or coalesce.

Figure 4B:
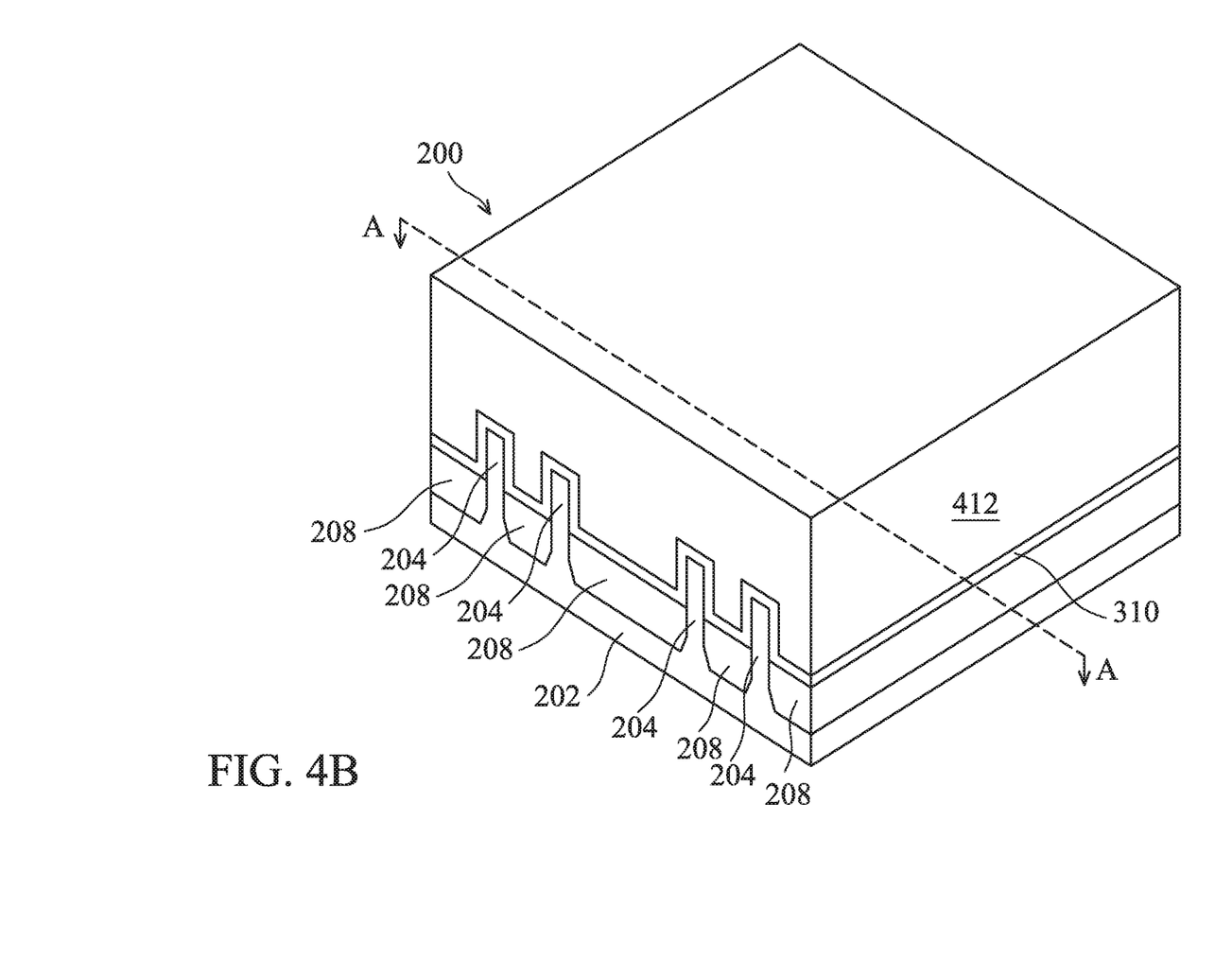

Due to the lateral growth fronts in a trench (e.g., proceeding laterally from sidewalk of respective fins 204) that merge together, seams and/or voids 414 may nevertheless be formed in the dummy gate layer 412 in the trenches. The merging of the lateral growth fronts can create seams and/or voids 414 in the dummy gate layer 412 between neighboring fins 204, as shown in FIG. 4A. FIGS. 4A and 4B illustrate seams or voids 414 according to an illustrative example. In some examples, multiple seams and/or voids 414 can be formed in trenches; the seams and/or voids 414 can be formed differently in different trenches; the scams and/or voids 414 can have different forms, shapes, and depths in the trenches; etc.

After the trenches are filled, the deposition process can continue until a desired thickness of the dummy gate layer 412 above the top surfaces of the fins 204 is achieved.

FIGS. 4A and 4B illustrate the dummy gate layer 412 after the deposition of the dummy gate layer 412 and subsequent planarization of the dummy gate layer 412. In some example, before planarization, the top surface of the dummy gate layer 412 may not be even after the deposition at operation 106. As shown, trenches between neighboring fins 204 have been filled after a suitable number of cycles of the cyclic deposition-etch processes. In some examples, such as illustrated in FIGS. 4A and 4B, the dummy gate layer 412 is planarized, such as by a chemical mechanical planarization (CMP), to form a top surface of the dummy gate layer 412 to be planar.

FIG. 4B illustrates a three-dimensional view of the semiconductor device structure 200 of FIG. 4A where the dummy gate layer 412 has been formed over the substrate surface according to some embodiments. After the dummy gate layer 412 is formed and the trenches are filled, the process flow 100 may proceed to operation 108, as will be discussed below in more detail.

Figure 5A:
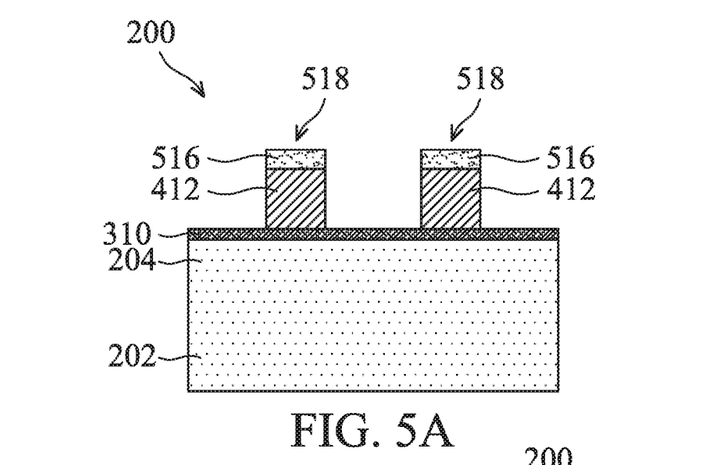
Figure 5B:
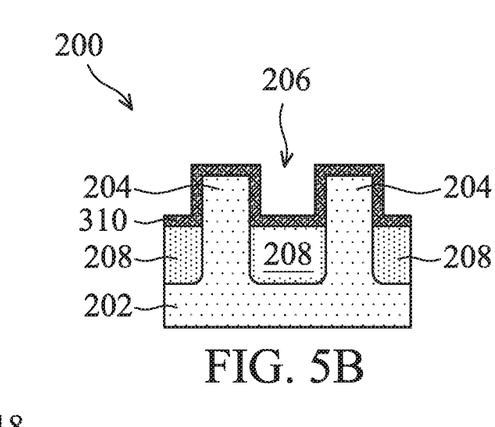
Figure 5C:
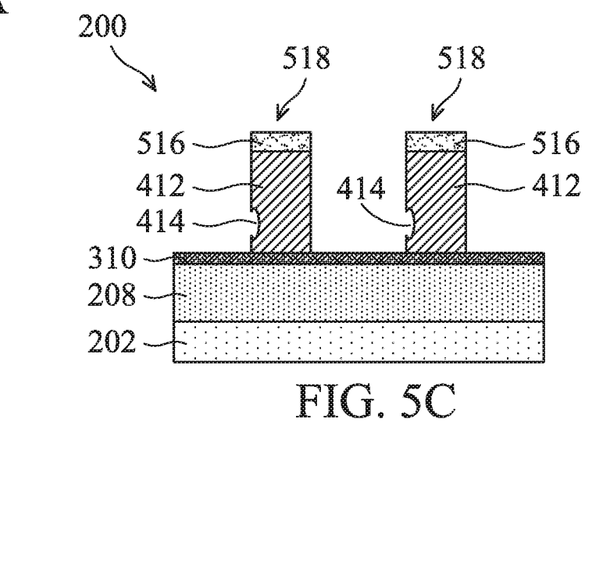
Figure 5D:
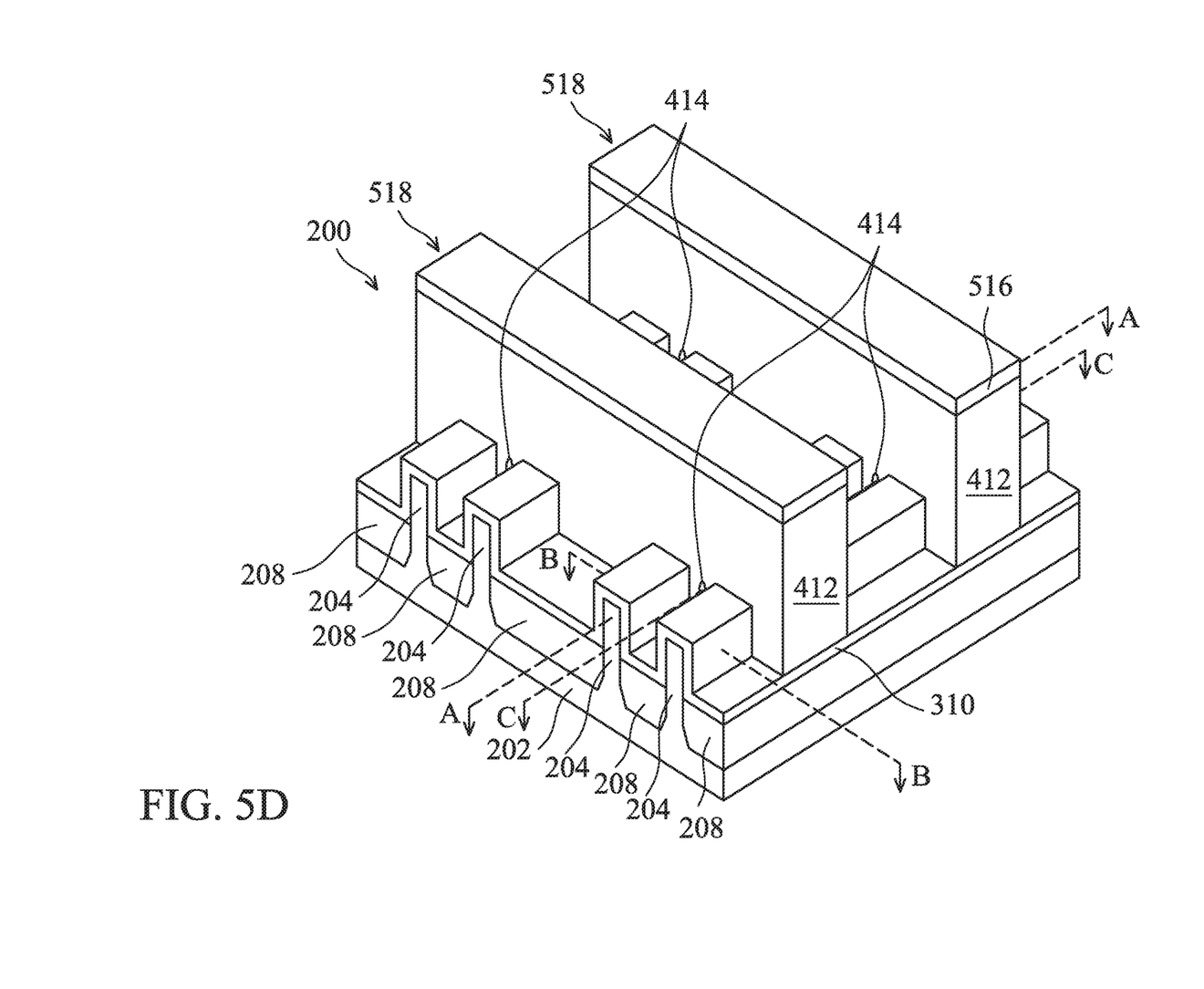

At operation 108, and with reference to FIGS. 5A, 5B, 5C, and 5D, a mask 516 is formed over the dummy gate layer 412, and the mask 516 and the dummy gate layer 412 (and seed layer if used) may then be patterned, for example, using photolithography and one or more etch processes to form the mask 516 and dummy gate layer 412 for each dummy gate structure 518, as shown in FIGS. 5A, 5C, and 5D. The mask 516 may include or be silicon nitride, silicon oxynitride, silicon carbon nitride, the like, or a combination thereof, deposited by CVD, physical vapor deposition (PVD), ALD, or any suitable deposition technique. Particularly, the dummy gate structures 518 are over and extend perpendicularly to the fins 204. As will become apparent subsequently, the interfacial dielectric layer 310 may remain un-patterned to act as an etch stop for a subsequent etching process.

FIG. 5D further illustrates reference cross-sections. Cross-section A-A is in a plane along, e.g., channels in one fin 204 between opposing source/drain regions. Cross-section B-B is in a plane perpendicular to cross-section A-A and is across source/drain regions in two neighboring fins 204. Cross-section B-B of FIG. 5D corresponds to a portion of the cross-section A-A of FIG. 4B; the cross-section B-B of FIG. 5D can be extrapolated to the cross-section A-A of FIG. 4B. Cross-section C-C of FIG. 5D is in a plane parallel to cross-section A-A in between two neighboring fins 204 (e.g., in a high aspect ratio trench). FIG. 5A and following figures ending with an "A" designation illustrate cross-sectional views at various instances of processing corresponding to cross-section A-A of FIG. 5D; FIG. 5B and following figures ending with a "B" designation illustrate cross-section views at various instances of processing corresponding to cross-section B-B of FIG. 5D; and FIG. 5C and following figures ending with a "C" designation illustrate cross-section views at various instances of processing corresponding to cross-section C-C of FIG. 5D.

Since the deposition process can create seams and/or voids 414 in the dummy gate layer 412 between neighboring fins 204, the patterning of the dummy gate layer 412 in operation 108, and illustrated in FIGS. 5A-5D, could expose the seam and/or void 414 at a sidewall of the dummy gate structure 518 as shown in FIGS. 5C and 5D. With the seam and/or void 414 exposed at the sidewall of the dummy gate structure 518, the one or more layers for the gate spacers 924 (the formation of which is describe in more detail below with reference to FIGS. 9A-9C) could be deposited in the seam and/or void 414, and therefore, the gate spacers 924 could be formed with a portion injected into the seam and/or void 414. This injected portion could cause defects in the removal of the dummy gate structure 518 and/or in the formation of the replacement gate structure, as described subsequently with respect to FIGS. 10A-10C. However, in some examples, the risk of a seam and/or void 414 being in the sidewall of the dummy gate structure 518 can be reduced (e.g., by performing the treatment, deposition, and etch processes described herein), which can reduce the risk of an injected portion of a gate spacer 924 being formed in the dummy gate layer 412.

FIGS. 5C and 5D illustrate seams and/or voids 414 according to an illustrative example. In some examples, there can be multiple seams and/or voids 414 formed in trenches; the seams or voids 414 can be formed differently in different trenches; the seams and/or voids 414 can have different forms, shapes, and depths in the trenches; etc. Although FIG. 5C shows seams or voids 414 that a formed a certain depth in the sidewalls of the dummy gate structure 518, in some examples, the seams and/or voids 414 could be formed across the entire width of the dummy gate layer 412.

Figure 6A:
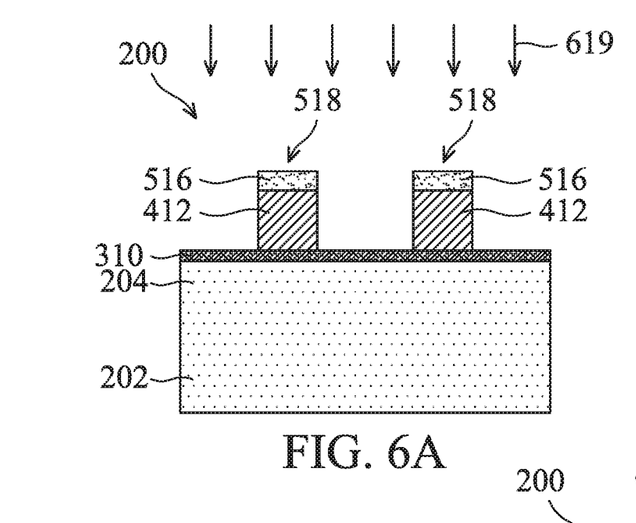
Figure 6B:
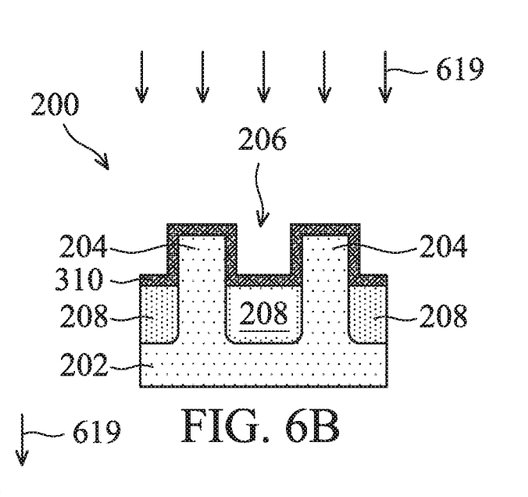
Figure 6C:
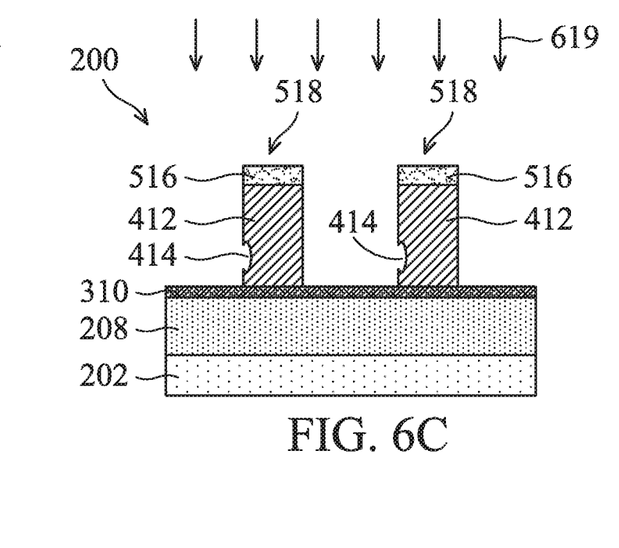

After patterning the dummy gate layer 412 to form the dummy gate structures 518, the process flow 100 may proceed to operation 110. At operation 110, a treatment process 619 can be performed on the sidewalls and top surfaces, as shown in FIGS. 6A-6C. The treatment process 619 may treat the sidewalls and top surfaces of the dummy gate structures 518 and exposed surfaces of the interfacial dielectric layer 310. As shown in FIGS. 6A-6C, the treatment process 619 treats the top surface of the mask 516, sidewall surfaces of the mask 516 and the dummy gate layer 412, and exposed surfaces of the interfacial dielectric layer 310. The treatment process 619 also treats the surfaces within the exposed seams and/or voids 414 in the sidewalls of the dummy gate layer 412. In some examples, the treatment process 619 is an oxide reduction process. The treatment process 619 may remove or reduce oxidized surfaces of the dummy gate layer 412 when the substrate is moved from a first chamber or tool after patterning the dummy gate layer 412 to a different tool or chamber before performing the deposition process at operation 112.

The treatment process 619 may include or be a reduction gas to reduce an oxide and/or may prevent oxidation and oxide residue after patterning of the dummy gate layer 412. The treatment process 619 may be performed by exposing the substrate surface to a hydrogen gas or a hydrogen plasma. In some examples, the treatment process 619 may include exposing the substrate surface to hydrogen ($H_2$) or a mixture of hydrogen and nitrogen. The hydrogen treatment process may result in the substrate surface (e.g., including exposed surfaces of the dummy gate layer 412) being terminated with hydrogen (e.g., a monolayer of hydrogen). The hydrogen terminated surfaces may create a better surface for the deposition described in more detail below with respect to FIGS. 7A-7C. In some examples, the treatment process 619 is performed at a temperature in a range from about 200 degrees Celsius to about 800 degrees Celsius. In some examples, the treatment process 619 is performed using a flow rate of the reduction gas that may vary based on the tool and process being used. In some examples, the treatment process 619 is performed at a pressure in a range up to about 100 Torr.

Figure 7A:
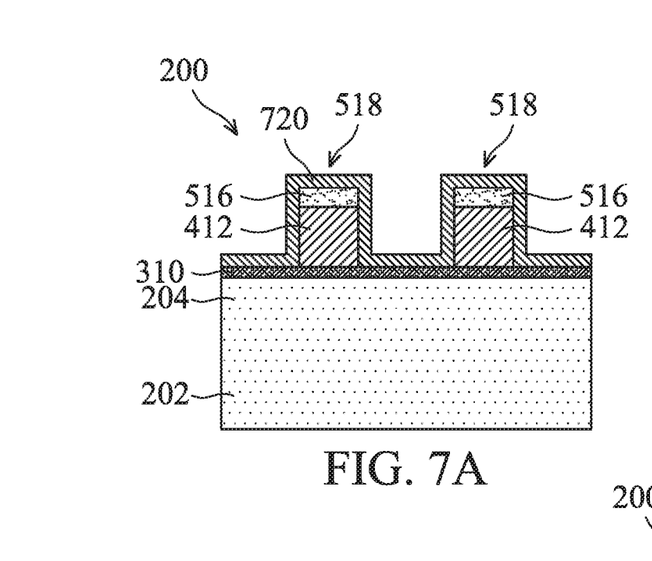
Figure 7B:
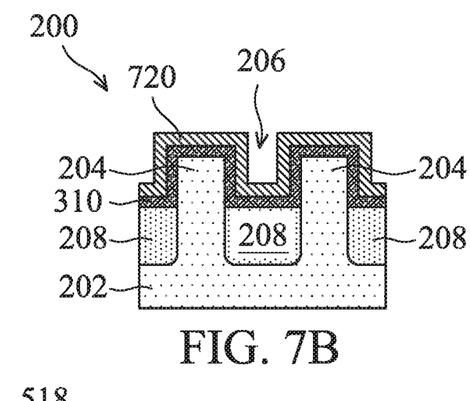
Figure 7C:
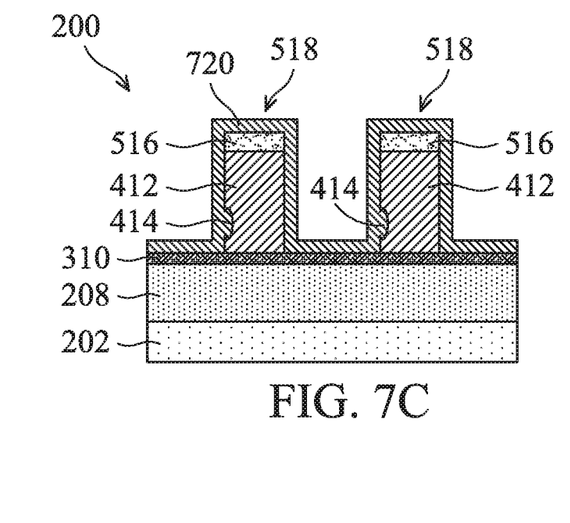

After the treatment process 619, the process flow 100 may proceed to operation 112. At operation 112, a deposition process deposits a filling layer 720, e.g., on the sidewalls and top surfaces of the dummy gate structures 518, as shown in FIGS. 7A-7C. The filling layer 720 is formed on the top surface of the mask 516, along sidewall surfaces of the mask 516 and the dummy gate layer 412, and conformally on the interfacial dielectric layer 310. The deposition process also fills the exposed seams and/or voids 414 in the sidewalls of the dummy gate layer 412. Thus, the seams and/or voids 414 are filled, which can reduce or substantially eliminate seams and/or voids 414 from the sidewalls of the dummy gate structures 518.

The filling layer 720 can be formed by suitable deposition technique such as CVD, LPCVD, PECVD, ALD, PEALD, PVD, or any suitable deposition technique. The filling layer 720 may be any suitable material. In some examples, the filling layer 720 is the same material as the dummy gate layer 412. In some examples, the filling layer 720 is amorphous silicon. In some examples, the material of the filling layer 720 has the same or similar etching properties as the dummy gate layer 412, such as by being the same materials or the same group material on the Periodic Table (e.g., IV group material such as Si, SiGe, or Ge). The filling layer 720 may have a same or similar etch rate as the dummy gate layer 412. As described in more detail below, the filling layer 720 can fill any seam and/or void 414 in sidewalls of the dummy gate layer 412, which can prevent subsequently formed gate spacers from injecting into the dummy gate layer 412 that could cause defects when the dummy gate structures 518 are removed, e.g., by etching. As will become apparent in subsequent description, if the materials of the filling layer 720 and dummy gate layer 412 have the same etching properties during the removal of the dummy gate layer 412, the portion of the filling layer 720 that remains in any void and/or seam can be removed when the dummy gate layer 412 is removed. The deposition may be performed at a temperature in a range from about 350 degrees Celsius to about 530 degrees Celsius. In some examples, the precursor used during deposition process is silane ($SiH_4$), disilane ($Si_2H_6$), or other precursors, such as described above for the deposition of the dummy gate layer 412. The filling layer 720 may be a thin layer having a thickness in a range from about 2 angstroms to about 100 angstroms. In some examples, the deposition process is performed using a flow rate that can vary based on the tool, pressure, and process being used. In some examples, the deposition process is performed at a pressure in a range up to about 1 Torr.

Figure 8A:
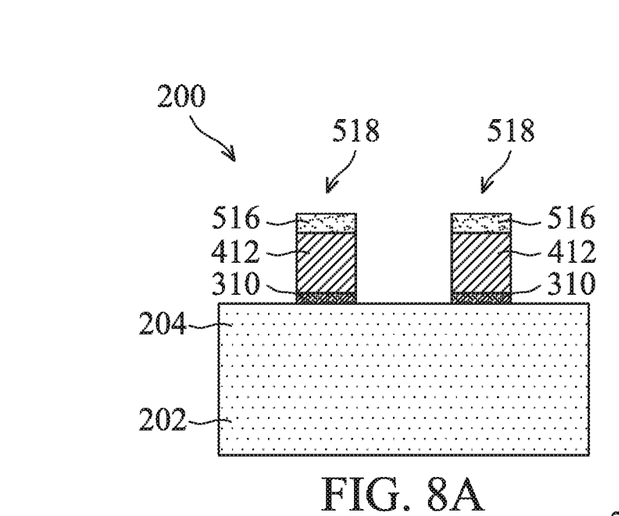
Figure 8B:
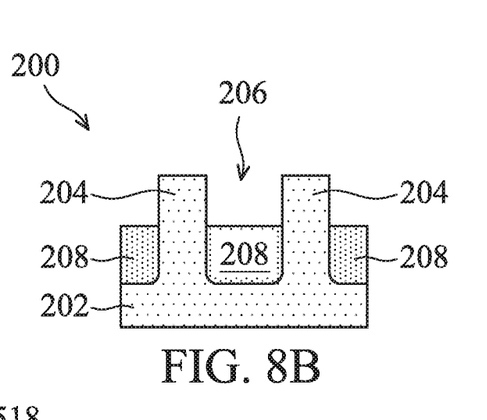
Figure 8C:
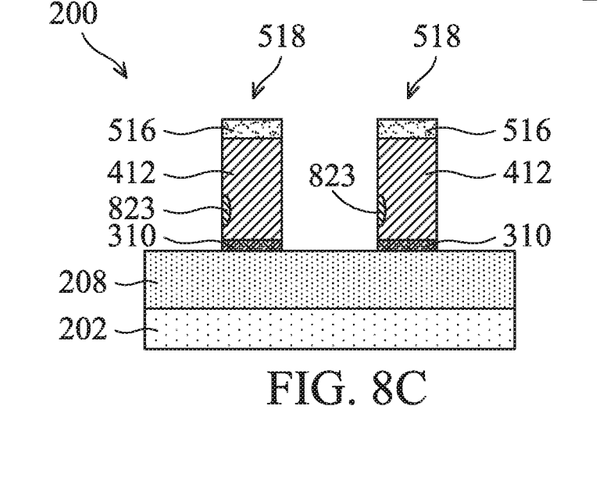

After performing the deposition process to form the filling layer 720 filling the exposed seams and/or voids 414 in the dummy gate layer 412, the process flow 100 may proceed to operation 114. At operation 114, an etching process can be performed on the filling layer 720, as shown in FIGS. 8A-8C. The etching process may remove the filling layer 720 from the sidewalls and top surfaces of the dummy gate structures 518, but leave the seams and/or voids 414 filled with a filling layer 823. As shown in FIGS. 8A-8C, the filling layer 720 is removed from the top surface of the mask 516, and the sidewall surfaces of the mask 516 and the dummy gate layer 412, but the material of filling layer 720 is not removed from the seams and/or voids 414 forming the filling layer 823 The etch process may be an anisotropic etch process or a combination of an anisotropic and isotropic etch process steps. The etch process may be a plasma etch, RIE, NBE, or other suitable etch process. The etch process may be an isotropic etch, such as a wet etch, chemical etch, or other suitable etch process. The interfacial dielectric layer 310 may act as an etch stop for patterning the dummy gate layer 412 in FIGS. 5A-5D and for etching the filling layer 720 in FIGS. 8A-8C. After the etching of the filling layer 720, the interfacial dielectric layer 310 may also be patterned, such as by an appropriate etching process selective to the material of the interfacial dielectric layer 310, to be part of the dummy gate structures 518, such as illustrated in FIGS. 8A-8C, or may remain unpatterned.

In some examples, the etching process is an isotropic etch using a fluorine or chlorine etchant. In some examples, the isotropic etch is performed at a temperature in a range from about 315 degrees Celsius to about 415 degrees Celsius. In some examples, the etching process is performed at a pressure in a range less than about 3 Torr.

Although the treatment (operation 110), deposition (operation 112), and etching (operation 114) processes are described above with respect to the dummy gate structures 518, in some examples, the treatment, deposition, and etching processes may be performed at a different stage of fabrication of the semiconductor device structure for other structures. For example, the processes may be applied at another stage in which improved gap fill is desirable and/or where reduction/elimination of seams and/or voids is desirable. In some examples, the treatment, deposition, and etching processes may be performed for various different materials, such as SiN and/or $SiO_2$. In some examples, the treatment, deposition, and etching processes may be performed in a same chamber/tool or using different chambers/tools.

Figure 9A:
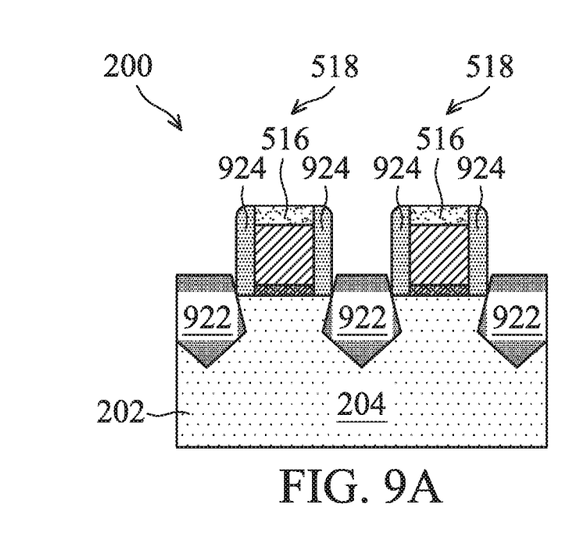
Figure 9B:
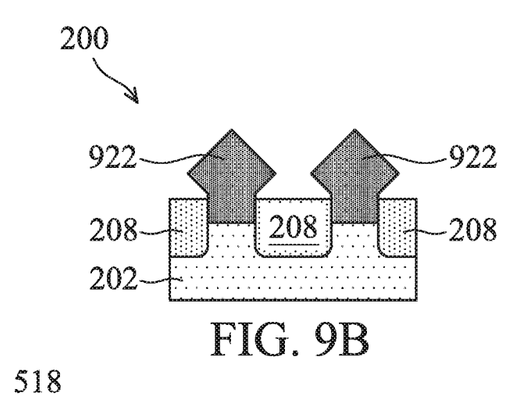
Figure 9C:
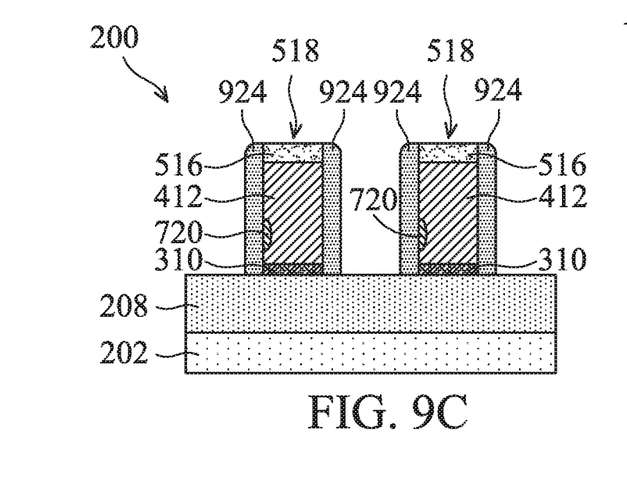

At operation 116, and with reference to FIGS. 9A-9C, gate spacers 924 are formed along sidewalls of the dummy gate structures 518 (e.g., sidewalls of the interfacial dielectric layer 310, dummy gate layer 412, and mask 516) and over the fins 204. The gate spacers 924 can also be formed along the filling layer 720 that is formed in any void and/or seam 414 in a sidewall of the dummy gate layer 412. The gate spacers 924 may be formed by conformally depositing one or more layers for the gate spacers 924 and anisotropically etching the one or more layers, for example. The one or more layers for the gate spacers 924 may include a material different from the material(s) for the dummy gate structure 518. In some embodiments, the gate spacer 924 may include or be a dielectric material, such as silicon oxygen carbide, silicon nitride, silicon oxynitride, silicon carbon nitride, the like, multi-layers thereof, or a combination thereof, and may be deposited by any suitable deposition technique. An anisotropic etching process is then performed to remove portions of the layers to form the gate spacers 924, as depicted in FIGS. 9A-9C.

In some examples, the dummy gate layer 412 and filling layer 720 are amorphous silicon, and the deposition of the one or more layers for the gate spacers 924 and/or the anisotropic etching process can be performed at temperatures that cause the amorphous silicon to crystallize into polycrystalline silicon (e.g., polysilicon). Hence, in subsequent processing, the dummy gate layer 412 and filling layer 720 may be polysilicon. With the dummy gate layer 412 and filling layer 720 being amorphous silicon at the initiation of the deposition of the one or more layers for the gate spacers 924, smooth sidewalls for the gate spacers (and subsequently formed replacement gate structure) may be achieved.

After the gate spacers 924 are formed, source/drain regions 922 may be formed in the fins 204, as depicted in FIGS. 9A and 9B. In some examples, recesses can be etched in the fins 204 using the dummy gate structures 518 and gate spacers 924 as masks (such that recesses are formed on opposing sides of the dummy gate structures 518), and a material may be epitaxially grown in the recesses to form the source/drain regions 922. Additionally or alternatively, the source/drain regions 922 may be formed by implanting dopants into the fins 204 and/or the epitaxial source/drain regions 922 using the dummy gate structures 518 as masks (such that the source/drain regions 922 are formed on opposing sides of the dummy gate structures 518).

Depending on the conductivity type of the transistor, the material for the source/drain regions 922 may be chosen to include or be silicon germanium, silicon carbide, silicon phosphorus, silicon carbon phosphorus, germanium, a III-V compound semiconductor, a II-VI compound semiconductor, or the like. The source/drain regions 922 may be raised with respect to the fins 204 and may have facets, which may correspond to crystalline planes of the semiconductor substrate 202.

Figure 10A:
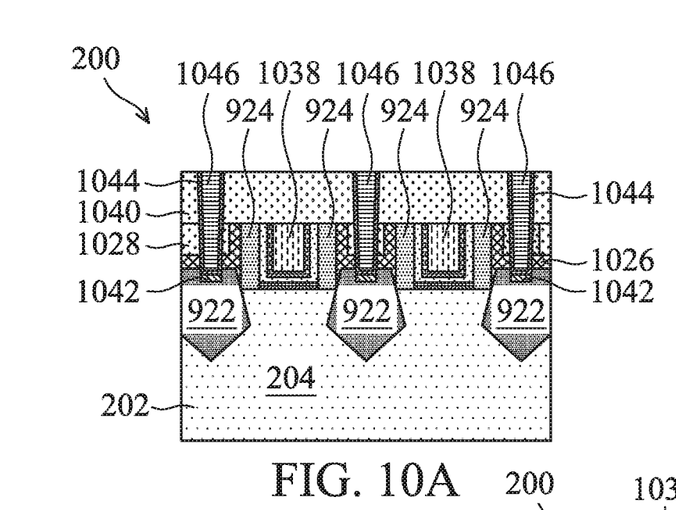
Figure 10B:
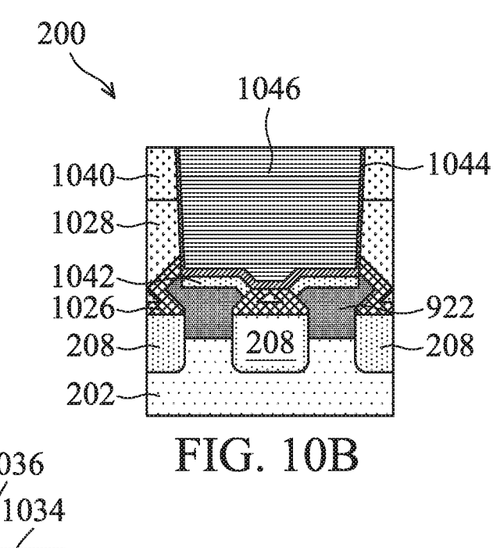
Figure 10C:
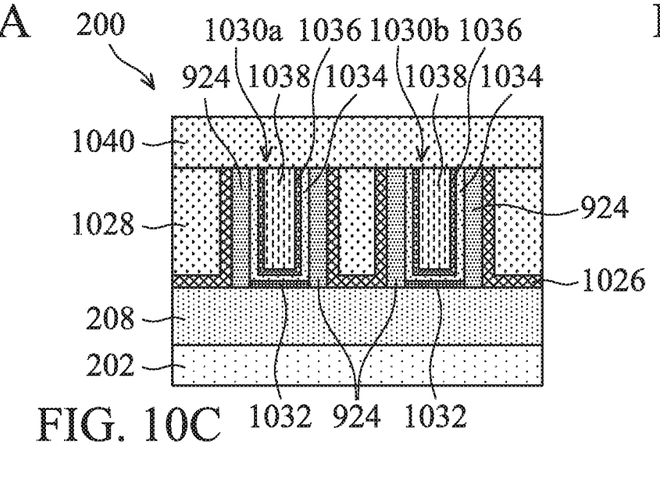

As shown in FIGS. 10A, 10B, and 10C, a contact etch stop layer (CESL) 1026 and a first interlayer dielectric (ILD) 1028 are sequentially formed on surfaces of the source/drain regions 922, sidewalls and top surfaces of the gate spacers 924, top surfaces of the masks 516, and top surfaces of the isolation regions 208 using any suitable deposition technique. The CESL 1026 is deposited conformally and may include or be silicon nitride, silicon carbon nitride, silicon carbon oxide, carbon nitride, the like, or a combination thereof. The first ILD 1028 may include or be tetraethylorthosilicate (TEOS) oxide, silicon dioxide, a low-k dielectric material (e.g., a material having a dielectric constant lower than silicon dioxide), or another material. A CMP process may then be performed to planarize the first ILD 1028 and the CESL 1026 and to remove the masks 516 of the dummy gate structures 518, thereby leveling the top surface of the first ILD 1028 and CESL 1026 with the top surfaces of the dummy gate layers 412.

At operation 118, and with reference to FIGS. 10A-10C, the dummy gate structures 518 are removed and replacement gate structures 1030a, 1030b are formed where the dummy gate structures 518 were removed. The dummy gate structures 518 can be removed using one or more etch processes. Upon removal of the dummy gate structures 518, recesses are formed between the gate spacers 924 where the dummy gate structures 518 are removed, and channel regions of the fins 204 are exposed through the recesses.

As described previously, an injected portion of a gate spacer 924 could be formed if a seam and/or void 414 is exposed in the dummy gate structure 518 during the formation of the gate spacer 924. The injected portion could act as an etch stop and prevent removal of some of the dummy gate structure 518 (e.g., such as underlying the injected portion). This could cause a defect in the subsequently formed replacement gate structure. In some examples, as described above, the risk of an injected portion of a gate spacer 924 in a dummy gate layer 412 can be reduced by forming a filling layer 720 in any void and/or seam 414, which can reduce the risk of such an injected portion acting as an etch stop and causing a defect. Hence, yield in the manufactured device can be increased.

The replacement gate structures 1030a, 1030b are then formed in the recesses where the dummy gate structures 518 were removed. The replacement gate structures 1030a, 1030b each may include, as illustrated in FIGS. 10A and 10C, an interfacial dielectric 1032, a gate dielectric layer 1034, one or more optional conformal layers 1036, and a gate conductive fill material 1038. The interfacial dielectric 1032 is formed on top surfaces of the fins 204 along the channel regions. The interfacial dielectric 1032 can be an oxide (e.g., silicon oxide) formed by thermal or chemical oxidation of the fin 204, and/or an oxide (e.g., silicon oxide), nitride (e.g., silicon nitride), and/or another dielectric layer using any suitable deposition technique.

The gate dielectric layer 1034 can be conformally deposited in the recesses where dummy gate structures 518 were removed (e.g., on the interfacial dielectric 1032, and sidewalls of the gate spacers 924) and on the top surfaces of the first ILD 1028, the CESL 1026, and gate spacers 924. The gate dielectric layer 1034 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 1036 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A layer for the gate conductive fill material 1038 is formed over the one or more optional conformal layers 1036, if implemented, and/or the gate dielectric layer 1034. The layer for the gate conductive fill material 1038 can fill remaining recesses where the dummy gate structures 518 were removed. The layer for the gate conductive fill material 1038 may be or include a metal-containing material such as tungsten, cobalt, aluminum, ruthenium, copper, multi-layers thereof, a combination thereof, or the like.

A planarization process, like a CMP, may remove portions of the layer for the gate conductive fill material 1038, one or more optional conformal layers 1036, and gate dielectric layer 1034 above the top surfaces of the first ILD 1028, the CESL 1026, and gate spacers 924. The replacement gate structures 1030a, 1030b including the gate conductive fill material 1038, one or more optional conformal layers 1036, gate dielectric layer 1034, and interfacial dielectric 1032 may therefore be formed as illustrated in FIGS. 10A and 10C.

A second ILD 1040 is formed over the first ILD 1028, replacement gate structures 1030a, 1030b, gate spacers 924, and CESL 1026, as shown in FIGS. 10A-10C. The second ILD 1040 may include or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

After the second ILD 1040 is formed, source/drain contact openings are formed through the second ILD 1040, the first ILD 1028, and the CESL 1026 to the source/drain regions 922 to expose at least portions of the source/drain regions 922. The second ILD 1040, the first ILD 1028, and the CESL 1026 may be patterned with the openings, for example, using photolithography and one or more etch processes, such as a dry etch or any suitable anisotropic etch process. The source/drain contact openings allow making electrical contact to the source/drain regions 922 for the transistors.

After the formation of the source/drain contact openings, conductive features are formed in the openings to the source/drain regions 922. The conductive features may include a silicide region 1042 formed on the source/drain regions 922, a barrier layer 1044, and a conductive material 1146 on the barrier layer 1044. The silicide region 1042 may be formed by thermally reacting an upper portion of the source/drain regions 922 with a metal layer (not shown), such as titanium, tantalum, or the like, formed on the source/drain regions 922. The barrier layer 1044 is conformally deposited in the source/drain contact openings on the silicide region 1042 and over the second ILD 1040, the first ILD 1028, and the CESL 1026, as shown in FIGS. 10A-10C. The barrier layer 1044 may be or include titanium nitride, titanium oxide, tantalum nitride, tantalum oxide, any suitable transition metal nitrides or oxides, the like, or any combination thereof, and may be deposited by any suitable deposition technique. The conductive material 1046 may be or include cobalt, tungsten, copper, ruthenium, aluminum, gold, silver, alloys thereof, the like, or a combination thereof, and may be deposited by any suitable deposition technique. After the conductive material 1046 is deposited, excess conductive material 1046 and barrier layer 1044 may be removed by using a planarization process, such as a CMP. The planarization process may remove excess conductive material 1046 and barrier layer 1044 from above a top surface of the first ILD 1028. Hence, top surfaces of the conductive material 1046, the barrier layer 1044, and the first ILD 1028 may be coplanar. The conductive features may be referred to as contacts, plugs, etc.

Various embodiments described herein may offer several advantages. It will be understood that not all advantages have been necessarily described herein, no particular advantage is required for any embodiment, and other embodiments may offer different advantages. As an example, embodiments described herein include improved gate formation methods for forming a dummy gate layer (e.g., a-Si) in high aspect ratio trenches and, after patterning the dummy gate layer to form dummy gate structures, using treatment, deposition, and etching processes to fill exposed seams and/or voids in sidewalls of the dummy gate structures. Additionally, by reducing or eliminating voids and/or seams, risk of defects in replacement gate structures can be reduced.

In an embodiment, a method for semiconductor processing is provided. The method includes forming fins on a substrate. Sidewalls of the fins and a bottom surface between the sidewalls of the fins define a trench therebetween. The method includes forming a gate structure over the fins. The gate structure has a sidewall with a defect region formed therein. The method includes forming a filling layer to fill the defect region in the sidewall of the gate structure.

In another embodiment, the method includes performing a conformal deposition process to form a film over a bottom surface and along sidewall surfaces of a feature on a substrate to fill the feature with the film. The method includes patterning the film to form a structure having a sidewall. The sidewall of the structure has a defect region therein. The method includes performing a treatment process on the sidewall of the structure. The method includes forming a filling layer along the sidewall of the structure to fill the defect region. The method includes etching the filling layer from the sidewall of the structure. A portion of the filling layer remains in the defect region after the etching.

In yet another embodiment, the method includes forming fins on a substrate. Sidewalls of the fins and a bottom surface between the sidewalls of the fins define a trench therebetween. The method includes depositing a silicon gate layer in the trench. The silicon gate layer merges by lateral growth from the sidewalls of the fins. The silicon gate layer includes one or more seams or voids formed therein. The method includes patterning the silicon gate layer to form a dummy gate structure over the fins. The dummy gate structure has a top surface and sidewalls with a number of the one or more seams or voids exposed thereon. The method includes treating the sidewalls and top surface of the dummy gate structure and surfaces of the number of the one or more seams or voids with hydrogen. The method includes depositing a silicon layer along the sidewalls and top surface of the dummy gate structure. The deposition fills the number of the one or more seams or voids. The method includes performing an etch process to remove the silicon layer from the sidewalls and top surface of the of the dummy gate structure. Respective portions of the silicon layer remain in the number of the one or more seams or voids after the etch process is performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
    forming fins on a substrate, sidewalls of the fins and a bottom surface between the sidewalls of the fins defining a trench therebetween;
    forming a dummy gate structure over the fins, the dummy gate structure having a sidewall with a defect region formed therein;
    forming a filling layer to completely cover the dummy gate structure and to fill the defect region in the sidewall of the dummy gate structure, the filling layer consisting essentially of silicon;
    removing a first portion of the filling layer, wherein after removing the first portion of the filling layer a second portion of the filling layer remains in the defect region;
    forming a dielectric material on opposing sides of the dummy gate structure; and
    removing the dummy gate structure and the second portion of the filling layer.

2. The method of claim 1, wherein forming the filling layer in the defect region in the sidewall of the dummy gate structure comprises:
    treating the sidewall of the dummy gate structure;
    depositing the filling layer along the sidewall of the dummy gate structure and in the defect region; and
    performing an etch process to remove the filling layer from the sidewall of the dummy gate structure, wherein the second portion of the filling layer remains in the defect region.

3. The method of claim 2, wherein the treating comprises exposing the sidewall of the dummy gate structure to a hydrogen gas or a hydrogen plasma.

4. The method of claim 2, wherein depositing the filling layer comprises performing a chemical vapor deposition (CVD) process.

5. The method of claim 2, wherein the etch process comprises an anisotropic etch process.

6. The method of claim 1, wherein forming the dummy gate structure over the fins comprises:
depositing a dummy gate layer in the trench, the dummy gate layer merging by lateral growth from the sidewalls of the fins, the defect region being formed in the dummy gate layer by the merging from the sidewalls of the fins; and
patterning the dummy gate layer, wherein the sidewall of the dummy gate structure is formed by the patterning the dummy gate layer.

7. The method of claim 1, wherein the dummy gate structure and the second portion of the filling layer are removed simultaneously using a same etch process.

8. The method of claim 7, wherein the dummy gate structure and the filling layer are amorphous silicon.

9. The method of claim 1, wherein forming the dielectric material comprises:
forming a gate spacer on the sidewall of the dummy gate structure and the second portion of the filling layer.

10. A method for semiconductor processing, the method comprising:
performing a conformal deposition process to form a film over a bottom surface and along sidewall surfaces of a feature on a substrate to fill the feature with the film;
patterning the film to form a structure having a first sidewall, a second sidewall opposite the first sidewall, and a top surface extending from the first sidewall to the second sidewall, wherein the first sidewall of the structure has a defect region therein, the defect region comprising a recess, the first sidewall of the structure extending vertically from the bottom surface of the feature;
performing a treatment process on the first sidewall of the structure;
forming a filling layer consisting essentially of silicon along the first sidewall and the second sidewall of the structure, wherein the filling layer fills the recess;
etching the filling layer from the first sidewall and the second sidewall of the structure, wherein a portion of the filling layer remains in the recess after the etching; and
after etching the filling layer from the first sidewall of the structure, replacing the structure and the portion of the filling layer with a conductive gate structure.

11. The method of claim 10, wherein the film merges by lateral growth from the sidewall surfaces of the feature.

12. The method of claim 10, wherein the treatment process comprises a hydrogen treatment process.

13. The method of claim 10, wherein:
the feature is a trench defined at least in part by fins; and
the structure is a dummy layer of a dummy gate structure over the fins.

14. A method for semiconductor processing, the method comprising:
forming fins on a substrate, sidewalls of the fins and a bottom surface between the sidewalls of the fins defining a trench therebetween;
depositing a silicon gate layer in the trench, the silicon gate layer merging by lateral growth from the sidewalls of the fins, wherein the silicon gate layer includes one or more voids formed therein;
patterning the silicon gate layer to form a dummy gate structure over the fins, the dummy gate structure having a top surface and sidewalls, wherein patterning exposes a first void of the one or more voids to form a recess in the sidewalls;
treating the sidewalls and top surface of the dummy gate structure and surfaces of the recess with hydrogen;
depositing a silicon layer along the sidewalls and top surface of the dummy gate structure, wherein the deposition fills the recess, wherein the silicon layer consists essentially of silicon;
performing an etch process to remove the silicon layer from the sidewalls and top surface of the dummy gate structure, a portion of the silicon layer remaining in the recess as a recess fill after the etch process is performed;
forming a dielectric layer over the sidewalls of the dummy gate structure, the dielectric layer covering the recess fill; and
after forming the dielectric layer, removing the dummy gate structure and the recess fill to form an opening.

15. The method of claim 14, wherein the silicon gate layer and the silicon layer are amorphous silicon.

16. The method of claim 14, wherein treating the sidewalls and top surface of the dummy gate structure and surfaces of the recess with hydrogen comprises exposing the sidewalls and top surface of the dummy gate structure and surfaces of the one or more voids to a hydrogen gas or a hydrogen plasma.

17. The method of claim 14, wherein depositing the silicon layer comprises performing a chemical vapor deposition (CVD) process.

18. The method of claim 14, wherein the etch process comprises anisotropic etch process.

19. The method of claim 14, wherein forming the dielectric layer comprises forming respective gate spacers on the sidewalls of the dummy gate structure, and further comprising forming a replacement gate structure over the fins and in the opening.

20. The method of claim 10, wherein replacing the structure and the portion of the filling layer comprises etching the film and the filling layer with a same etchant.

* * * * *